United States Patent
Vink et al.

(10) Patent No.: US 7,078,715 B2
(45) Date of Patent: Jul. 18, 2006

(54) LITHOGRAPHIC APPARATUS AND APPARATUS ADJUSTMENT METHOD

(75) Inventors: Jacob Willem Vink, Eindhoven (NL); Sjoerd Nicolaas Lambertus Donders, 'S-Hertogenbosch (NL); Theodorus Marinus Modderman, Nuenen (NL); Theodorus Petrus Maria Cadee, Vlierden (NL)

(73) Assignee: ASML Netherlands B.V., Veldhoven (NL)

( * ) Notice: Subject to any disclaimer, the term of this patent is extended or adjusted under 35 U.S.C. 154(b) by 141 days.

(21) Appl. No.: 10/915,702

(22) Filed: Aug. 11, 2004

(65) Prior Publication Data
US 2005/0061995 A1  Mar. 24, 2005

(30) Foreign Application Priority Data
Aug. 12, 2003  (EP) .................................. 03077530

(51) Int. Cl.
*G21K 5/10*  (2006.01)
(52) U.S. Cl. .............................. 250/492.22; 250/492.2; 250/492.1
(58) Field of Classification Search .............. 250/492.2
See application file for complete search history.

(56) References Cited

U.S. PATENT DOCUMENTS

| | | | |
|---|---|---|---|
| 4,213,698 A | 7/1980 | Firtion et al. | |
| 5,094,536 A | 3/1992 | MacDonald et al. | |
| 5,643,472 A | 7/1997 | Engelsberg et al. | |
| 6,392,738 B1 | 5/2002 | van de Pasch et al. | |
| 6,556,281 B1 | 4/2003 | Govil et al. | |
| 2002/0117792 A1 | 8/2002 | Leidy et al. | |

FOREIGN PATENT DOCUMENTS

| | | |
|---|---|---|
| EP | 0480616 A2 | 4/1992 |
| EP | 0480616 A3 | 9/1992 |
| EP | 1 229 575 A2 | 8/2002 |
| EP | 1 229 575 A3 | 8/2002 |

OTHER PUBLICATIONS

European Search Report for Appln. No. 03077530.8, dated Jul. 9, 2004.

*Primary Examiner*—Nikita Wells
*Assistant Examiner*—Phillip A. Johnston
(74) *Attorney, Agent, or Firm*—Pillsbury Winthrop Shaw Pittman LLP

(57) ABSTRACT

A lithographic projection apparatus includes a beam production system for projecting a patterned beam of radiation onto a target portion of a substrate, and a support table for supporting an article. The support table has a support surface and an array of protrusions extending from the support surface to support the article on the protrusions. The apparatus also includes a detector for detecting height deviations of the protrusions that affect a surface flatness of the article, a height adjustment device arranged to independently modify a height of the individual protrusions when the support table is operable in the apparatus, and a controller coupled between the detector and the height adjustment device and arranged to control the height adjustment device to adjust the height of the protrusions corresponding to the detected height deviations of the protrusions that affect the surface flatness of the article.

16 Claims, 4 Drawing Sheets

LITHOGRAPHIC APPARATUS AND APPARATUS ADJUSTMENT METHOD

CROSS-REFERENCE TO RELATED APPLICATIONS

This application claims the benefit of priority from European Patent Application No. 03077530.8, filed Aug. 12, 2003, the entire content of which is incorporated herein by reference.

FIELD

The present invention relates to a lithographic projection apparatus and an apparatus adjustment method.

BACKGROUND

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described hereabove, the patterning device can include one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required. For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

European Patent Application No 1093022 and corresponding U.S. Pat. No. 6,392,738, which are incorporated herein by way of reference, address cleaning of the substrate support table. The substrate support tables used in lithography have a support surface with protrusions that extend substantially perpendicularly from the surface. In operation the backside of the substrate is supported on the protrusions, at a small distance from the support surface of the substrate table, in a position substantially perpendicular to the direction of propagation of the projection beam. Thus, the tops of the protrusions, rather than the support surface of the wafer table, define an effective support surface for the substrate.

EP1093022 and U.S. Pat. No. 6,392,738 describe that contamination present between the backside of the substrate and the protrusions can produce a deformation of the surface of the substrate with detrimental imaging effects. To solve this problem these documents disclose a detector for recognizing the presence of contamination. Preferably, the presence of contamination is recognized from unevenness of the surface of a substrate on the substrate support table. A suitable device for sensing the level of the substrate is already available, since it is used to adjust the height and tilt of the substrate during exposure.

The documents also disclose cleaning tools for removing contamination from the protrusions. These cleaning tools include a ceramic cleaning block that can be positioned against the support surface and moved in parallel to it to remove contamination by abrasive cleaning. Another embodiment of the cleaning tool includes a sponge provided with a solvent for removing contamination. A further embodiment includes a laser for removing the contamination by heat treatment.

EP1093022 and U.S. Pat. No. 6,392,738 emphasize that measures should be taken not to damage the protrusions themselves when the contamination is removed. In the embodiment of the cleaning block, for example the forces exerted by the cleaning block should not be so excessive as to damage the protrusions.

Unevenness of the supporting surface can also be caused by dissimilarity between the heights of material that makes up the protrusion itself. This is typically the case when a new substrate support table has been manufactured. Possibly uneven wear may also lead to unevenness. The substrate support table typically contains a chuck on which the table with the protrusions is supported. Unevenness may be the result of differences between the height of the protrusions, or in the backside of the table or in the chuck. Therefore these elements are carefully made level. Nevertheless it has been found that unevenness may also result when the chuck and the support table (and any other elements) are assembled or installed.

Similar problems may be encountered with support tables for other articles that have to be supported in a well-defined plane across the beam path, such as reflective masks or transmission masks.

SUMMARY

It is an aspect of the present invention to provide an improved lithographic projection apparatus and a method of operating such an apparatus, in which the effects of unevenness of the protrusions on a support table are counteracted.

The apparatus includes a beam production system for providing a projection beam of radiation, patterning the beam, and projecting the patterned beam onto a target portion of a substrate. The beam production system may include a radiation system for supplying a projection beam of radiation, and a support structure for supporting a patterning device. The patterning device serves to pattern the projection beam according to a desired pattern. The apparatus also includes a projection system for projecting the patterned beam onto a target portion of the substrate.

According to an embodiment of the invention, a lithographic projection apparatus is provided. The apparatus includes a beam production system for providing a beam of radiation, patterning the beam of radiation, and projecting the patterned beam onto a target portion of a substrate, and a support table for supporting an article so that a planar surface of the article lies in a predetermined plane transverse to a propagation direction of the projection beam. The support table has a support surface and an array of protrusions extending from the support surface to support the article on the protrusions. At least a top of each protrusion is substantially formed of an integral protrusion material. The apparatus also includes a detector for detecting height deviations of the protrusions that affect a surface flatness of the article, a height adjustment device arranged to independently modify a height of the protrusion material of individual protrusions when the support table is operable in the apparatus, and a controller coupled between the detector and the height adjustment device and arranged to control the height adjustment device to adjust the height of the protrusions corresponding to the detected height deviations of the protrusions that affect the surface flatness of the article.

According to the invention, an in situ height adjustment device is used to alter the height of the material that at least the top of individual protrusions are integrally made of, when the support table is at an operable position in the lithographic projection apparatus. By "operable," it is meant that the support table may be moved to a pattern projection position in the apparatus from the operable position without movements that are more disruptive to the support table assembly than during normal use. "Integrally made" refers to material that is used to manufacture the support table, but not to accidental foreign material such as pollution. By adjusting the height of the protrusions in the assembled support table in the lithographic apparatus, at such an operable position, a reliable height adjustment may be realized.

A detector determines which of the protrusions have a height deviation and a control unit controls the height adjustment device, for example, to remove a part of the material of selected protrusions with excess height, but not from other protrusions that do not have an excess height, or an excess height below a threshold. In a preferred embodiment, the apparatus only contains a material removing device, with no material being added to the protrusions.

In another example, the height adjustment device is used to heat selected protrusions that have a height deficit to make their material assume a semi-permanent swelled phase, which increases the height of the protrusion. The height adjustment device applies this treatment to selected protrusions; it does not cause material of protrusions to assume the swelled phase semi-permanently if they do not have a height deficit, or a height deficit below a threshold. As used herein, an "at least semi-permanent swelled phase" refers to a solid state phase that remains after the material has cooled down to normal operating temperature during a period of normal operation, for example, at least until renewed heating.

Preferably, the height deviation is determined by measuring the height profile of the planar surface of an article on the support table, for example, a calibration substrate that has substantially known, preferably flat, thickness profile that rests on the protrusions, and computing the excess heights from the measured height profile.

In an embodiment, the material removing device doubles as a device for removing contamination from the protrusions, such as disclosed in EP1093022. The difference is that in this embodiment, according to the present invention, the material removing device is arranged to operate on individual protrusions independently and that the removing strength of the material removing device is adjustable from a low level, at which only contamination is removed, to a high level where material that makes up the protrusions is removed as well. This may be realized, for example, when the removing device uses a laser beam by increasing the power of the laser beam and/or the duration of the interval that it is directed at a particular protrusion, and when the removing device uses an abrasive block, this may be realized by increasing the force with which the block is pressed against the particular protrusion, or by using different material or surface properties (i.e. roughness) for the abrasive block.

Preferably, the control unit controls the amount of material that is removed dependent on the measured amount of excessive height. This may be realized, for example, when the removing device uses a laser beam, by controlling the duration with which the laser beam is directed at a particular protrusion with a high power level, or a polishing duration when mechanical polishing is used. As an alternative, an arbitrary or fixed amount of material may be removed from protrusions with excess height, the process of measuring and removing being repeated until sufficient flatness has been achieved.

The invention also relates to a method of adjusting a height of protrusions on a support surface of a support table for holding an article with a planar surface in a predetermined plane transverse to a beam path in a lithographic projection apparatus, the support table including at least a chuck and a table surface element mounted on the chuck, the surface element including an array of protrusions, of which at least a top is integrally made of protrusion material, the protrusions extending from the support surface for supporting the article. The method includes measuring height deviations of respective ones of the protrusions that affect a surface flatness of the planar surface of the article when the surface element is mounted on the chuck; and adjusting a height of protrusion material, corresponding to the detected height deviations of respective ones of the protrusions selectively at the respective ones of the protrusions, while the surface element remains mounted on the chuck. As used herein "array" refers to any spatial arrangement of protrusions, not just to spatially periodic arrangements.

According to and embodiment of the invention, a method of adjusting a height of at least one protrusion on a support surface of a support table for holding an article with a planar surface in a predetermined plane transverse to a beam path in a lithographic projection apparatus is provided. The support table includes at least a chuck and a table surface element mounted on the chuck, and the surface element includes an array of protrusions, each of which includes a top that is integrally made of protrusion material. The protrusions extend from the support surface for supporting the article. The method includes measuring height deviations of the protrusions that affect a surface flatness of the planar surface of the article when the surface element is mounted on the chuck, and adjusting a height of the protrusion material of at least one protrusion that corresponds to the detected height deviations of the protrusions while the surface element remains mounted on the chuck.

By adjusting the heights in the assembled state of the support table, unevenness due to assembly can be removed. Preferably, this correction is executed in situ in the lithographic projection apparatus, so as to prevent effects of the installation of the support table on final unevenness.

According to an embodiment of the present invention, an article support system for use in a lithographic apparatus is provided. The support system includes a support table for supporting an article so that a planar surface of the article lies in a predetermined plane. The support table has a support surface and an array of protrusions extending from the support surface to support the article on the protrusions. At least a top of each protrusion is substantially formed of an integral protrusion material. The apparatus also includes a detector for detecting height deviations of the protrusions that affect a surface flatness of the article, a height adjustment device arranged to independently modify a height of the protrusion material of individual protrusions, and a controller coupled between the detector and the height adjustment device and arranged to control the height adjustment device to adjust the height of the protrusions corresponding to the detected height deviations of the protrusions that affect the surface flatness of the article.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 2048, 1064, 532, 365, 248, 193, 157 or 126 nm and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

DETAILED DESCRIPTION

Figure 1:
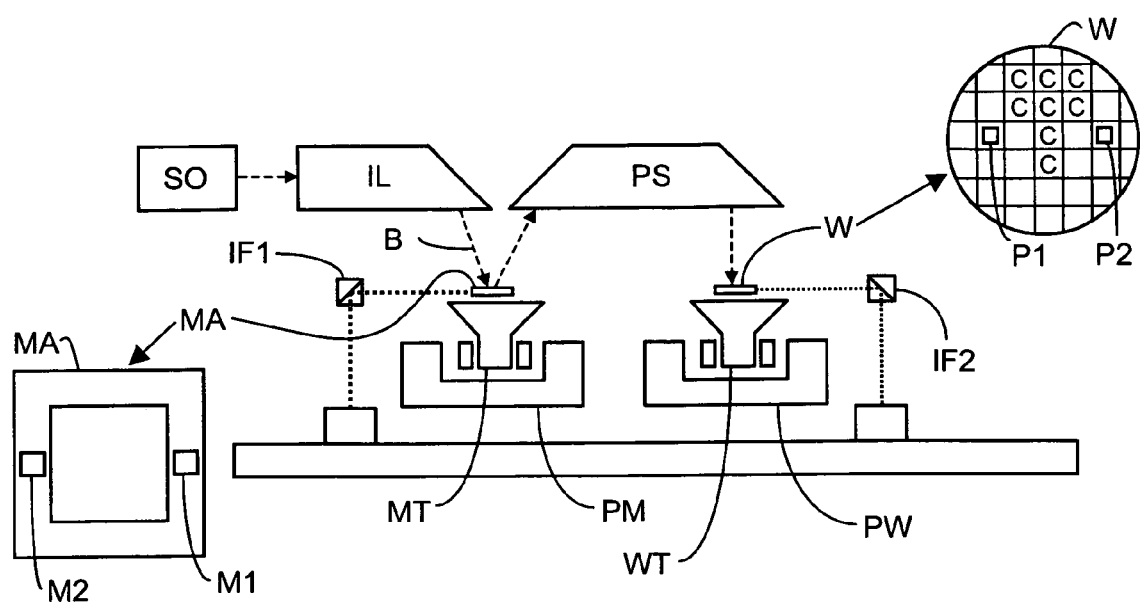
FIG. 1 depicts a lithographic projection apparatus according to an embodiment of the invention.

FIG. 1 schematically depicts a lithographic projection apparatus according to a particular embodiment of the invention. The apparatus includes: a radiation system SO, IL, for supplying a projection beam B of radiation (e.g. EUV radiation). A first object table (mask table) MT is provided with a mask holder for holding a mask MA (e.g. a reticle), and is connected to a first positioning device PM for accurately positioning the mask with respect to item PS. A second object table (substrate table) WT is provided with a substrate holder for holding a substrate W (e.g. a resist-coated silicon wafer), and is connected to a second positioning device PW for accurately positioning the substrate with respect to item PS. A projection system ("lens") PS (e.g. a mirror group) for imaging an irradiated portion of the mask MA onto a target portion C (e.g. including one or more dies) of the substrate W is also provided.

As here depicted, the apparatus is of a reflective type, i.e. has a reflective mask. However, in general, it may also be of a transmissive type, for example, with a transmissive mask. Alternatively, the apparatus may employ another kind of patterning device, such as a programmable mirror array of a type as referred to above.

The source SO (e.g. a discharge or laser-produced plasma source) produces a beam of radiation. This beam is fed into an illumination system (illuminator) IL, either directly or after having traversed a conditioning device, such as a beam expander, for example. The illuminator IL may include a adjusting device for setting the outer and/or inner radial extent (commonly referred to as σ-outer and σ-inner, respectively) of the intensity distribution in the beam. In addition, it will generally include various other components, such as an integrator and a condenser. In this way, the beam B impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that it may also be remote from the lithographic projection apparatus, the radiation beam which it produces being led into the apparatus (e.g. with the aid of suitable directing mirrors); this latter scenario is often the case when the source SO is an excimer laser. The current invention encompass both of these scenarios.

The beam B subsequently intercepts the mask MA, which is held on a mask table MT. Having been selectively reflected by the mask MA, the beam B passes through the projection system PS, which focuses the beam B onto a target portion C of the substrate W. With the aid of the second positioning device PW (and an interferometric measuring device IF2), the substrate table WT can be moved accurately, e.g. so as to position different target portions C in the path of the beam B. Similarly, the first positioning device PM can be used to accurately position the mask MA with respect to the path of the beam B, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam B.

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam B is caused to scan over a mask image; concurrently, the substrate table WT is simultaneously moved in the same or opposite direction at a speed V=Mv, in which M is the magnification of the projection system PS (typically, M=¼ or ⅕). In this manner, a relatively large target portion C can be exposed, without having to compromise on resolution.

Figure 2:
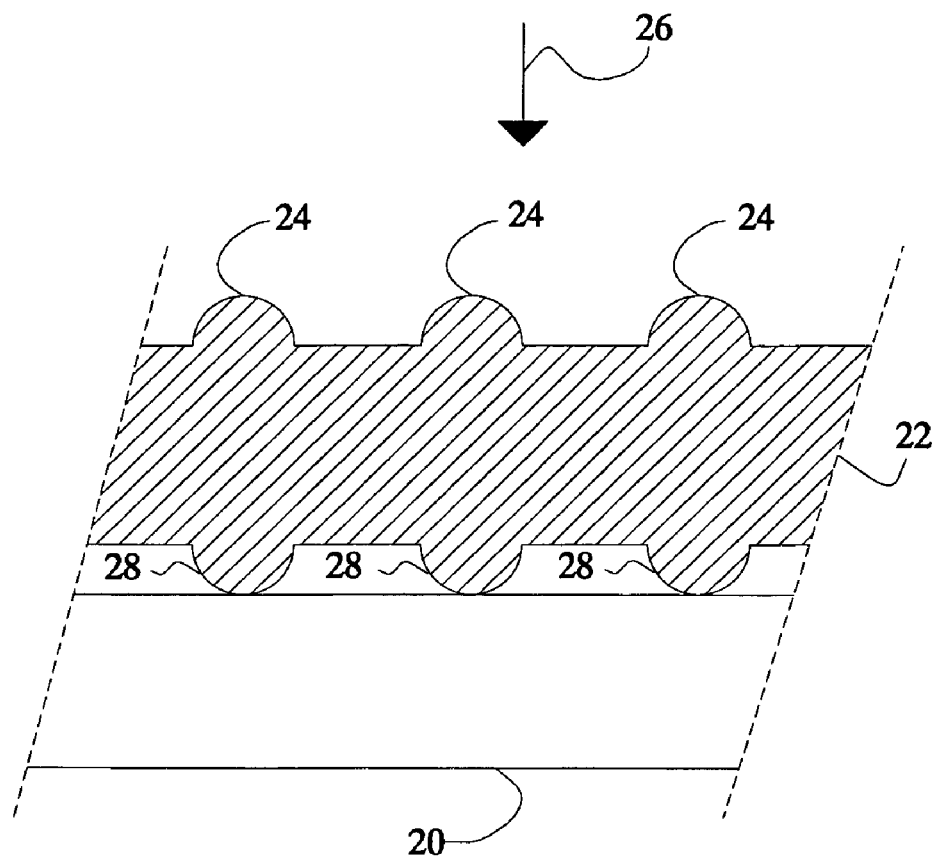
FIG. 2 is a cross-sectional view of a substrate table of the apparatus of FIG. 1.

FIG. 2 shows a cross section of part of a substrate table WT (not to scale). The substrate table WT includes a movable chuck 20, with a table 22 thereon. The propagation direction 26 of projection beam B is transverse to the surface of table 22. The surface of table 22 is provided with a pattern of protrusions 24 (sometimes called pimples or burls). The tops of protrusions 24 define a support surface. In operation, a substrate (not shown) is placed on top of table 22, where the backside of the substrate is supported by protrusions 24, so that the backside of the substrate follows the support surface. Similarly, the backside of table 22 is provided with further protrusions 28 via which table 22 rests on chuck 20.

The protrusions 24 typically have a size in the order of a millimeter and are provided at mutual distances of the order of several millimeters. Typically, both the table 22 and the protrusions 24 may both be made of a ceramic material. However, it should be realized that these dimensions and this material are merely a suitable example and do not limit the invention.

Figure 3:
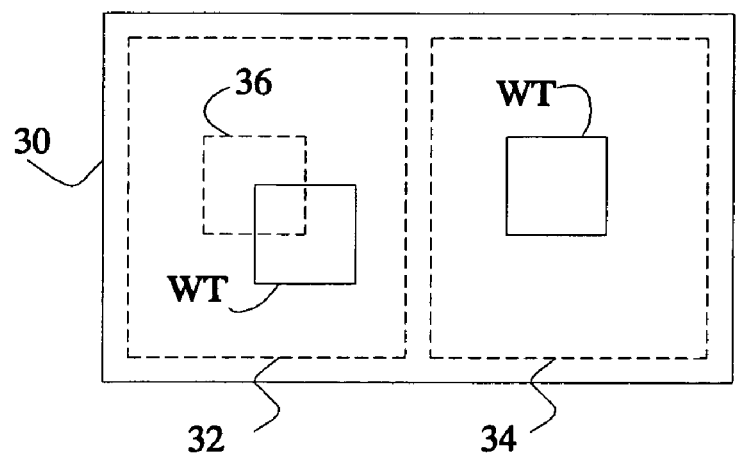
FIG. 3 is a top view of an illumination table of the apparatus of FIG. 1.

FIG. 3 shows a top view of the illumination table 30 within the photolithographic apparatus, wherein the substrate table WT is located. An illumination area 32 and a preparation area 34 are indicated. In each area 32, 34, a substrate table WT is shown. In operation the projection beam B impinges in a region 36 in the illumination area 32. One table with the substrate W on it is illuminated with projection beam B in illumination area 32 while the other table is prepared in the preparation area 34. Thus, the tables WT remain with the photolithographic apparatus.

Differences between the heights of the tops of different protrusions 24 induce unevenness of the surface of the substrate WT, which may give rise to imaging errors during illumination with the projection beam B. In modern photolithographic equipment, very small differences between the heights, of the order of tens of nanometers, may already be noticeable. The height differences are due to intrinsic differences between the size of the protrusions 24, and further protrusions 28, and unevenness of the chuck 20, but also to the interaction of the various components. Therefore, it has been found to be desirable to perform a height adjustment step after the substrate table has been assembled, i.e. after the table 22 has been placed on the chuck 20.

Adjustments of a size of tens of nanometers or higher of the height of protrusions 24 are made by removing part of the material of selected protrusions 24. According to one aspect of the invention adjustment of the height of protrusions 24 is performed in the photolithographic apparatus, on the table 30, where the substrate tables WT are also located during normal operation.

Figure 4:
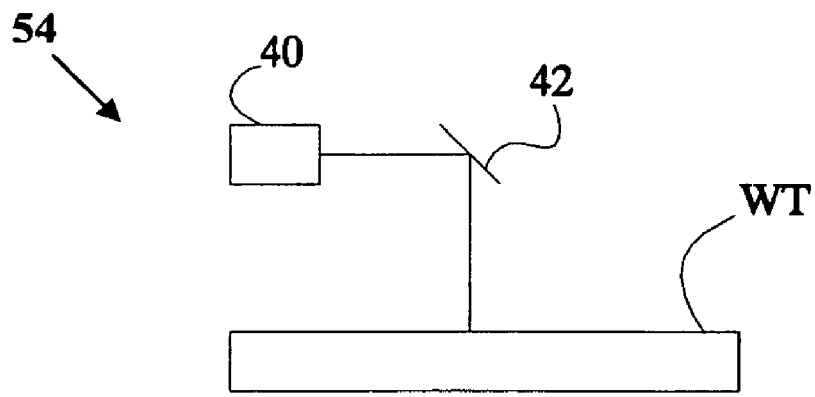
FIG. 4 is a schematic of a material removing device of the apparatus of FIG. 1.

FIG. 4 shows an embodiment of a material removing device 54. The figure shows the substrate table WT in side view (no protrusions are shown, because the protrusions are too small to be visible at the scale of the figure). The material removing device 54 contains a laser 40 and a mirror 42. The mirror 42 is used to direct the beam of the laser 40 to the surface of table WT. By rotating the mirror 42 and/or moving substrate table WT, the beam of the laser 40 may be directed to the locations of different protrusions on the substrate table WT. The beam is used to remove material from the protrusions, e.g. by heating the top of the protrusion so that part of the material of which the protrusion is made evaporates. The beam is focused, or otherwise of such narrow width that, when the intensity of the beam is high enough to remove material from a single protrusion at which the beam is directed, the beam intensity at other protrusions then being so low that substantially no material is removed from those other protrusions (for example because the intensity is insufficient to evaporate material from any the protrusion).

Typically, the laser 40 is operated in pulsed fashion, irradiating a particular protrusion with a number of "shots" in proportion to the excess height that has been determined for the protrusion. Of course, instead of the mirror 42, other ways of changing the location where the laser beam hits the substrate table may be used, such as moving the substrate table WT or the laser itself.

The device of FIG. 4 may also be used to increase the height of the protrusions. If has been found that, if the laser power density is set to a level that is insufficient to cause significant evaporation, laser heating may give rise to semi-permanent swelled state of the material of a protrusion after the material has cooled down. Various effects may give rise to such swelling. In one example, the protrusions are made of grains of one material (e.g. Silicon carbide) that are embedded in another material (e.g. Silicon). Heating causes the Silicon to aggregate, which leads to swelling. Such a phase is permanent in the sense that it remains after the protrusion has cooled down. Of course, this type of swelling may be realized with other material as well.

Other effects that may be used to cause swelling is the induction of phase separation between different components of the protrusion material due to heating, formation of a glassy phase (i.e. a solid phase with no long range lattice order) instead of a lattice order in the material, or the local formation of a different lattice phase. Formation of a glass phase may be used to create a semi-permanent swelling in the sense that after subsequent heating with slow cooling, the protrusion may be returned to a crystalline phase. Usually it is possible to return the material to its original phase.

In an embodiment of the invention, the swelled state is used to create a protrusion with increased height. For this purpose, the power density of the laser 40 may be adjusted (e.g. by reducing overall laser power or by using a less focused laser beam at the protrusion) so that no significant evaporation of protrusion material occurs, but the phase of the material is locally changed, preferably at the top of the protrusion. The amount of height adjustment may be controlled by adjusting the power dose and the duration of the laser pulse. By using a longer pulse, more material is able to migrate and a thicker layer of protrusion material may be affected. Selection of the laser wavelength may also be used to adjust the thickness of the affected layer. It is a matter of simple experimentation to relate experimentally determined height changes to combinations of laser pulse parameters that may be used to adjust the heights.

Figure 5:
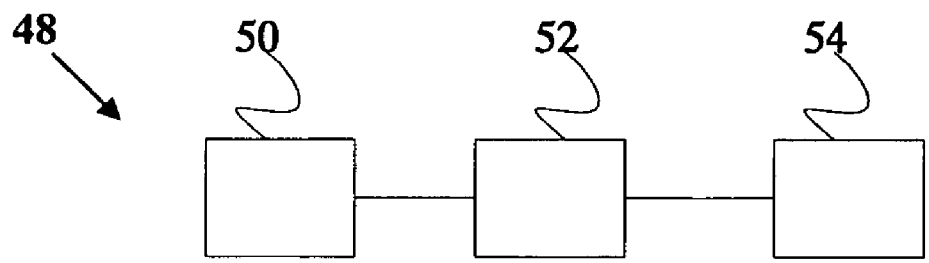
FIG. 5 is a schematic of a control sub-system of the apparatus of FIG. 1.

FIG. 5 shows a control sub-system 48 of the lithographic apparatus. The control subsystem 48 contains a measuring device 50 coupled to a processor 52, which in turn is coupled to the removing device 54 (the term "removing device" will be used generically in the following, with the understanding that this also covers use of the device to increase the height of the protrusion without removing a significant amount of material).

Figure 6:
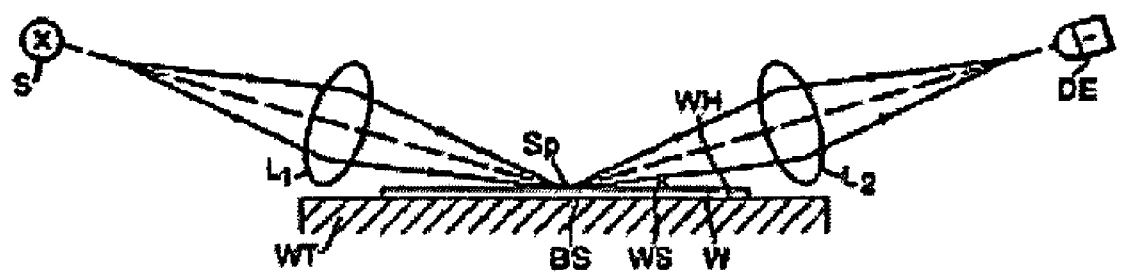
FIG. 6 is a schematic of a measuring device of the apparatus of FIG. 1.

FIG. 6 shows the measuring device 50. This measuring device 50 is a conventional device used for determining unevenness of a substrate W prior to illumination of that substrate with the projection beam B, in order to control focusing corrections during illumination of the substrate. Therefore, the measuring device 50 will not be described in detail. Briefly, the device 50 measures the level of a substrate W located with its backside BS on substrate table WT. A source of radiation S produces a spot SP on the surface of substrate W from where the radiation is reflected to detector DE, which is constructed to measure changes in height of the reflected radiation when spot SP and substrate W are moved relative to one another. Preferably, the measuring device 50 is also used during normal operation of the apparatus to determine unevenness of a substrate W prior to illumination of the substrate to control focusing corrections during illumination. Of course, different kinds of measuring devices may be used, such as mechanical or pneumatic sensors.

In operation, when a new substrate table has been installed in the lithographic apparatus, the processor 52 is made to execute a program for adjusting the heights of the protrusions. Optionally this program is also executed later to correct for wear. When the program is executed, a reference substrate of high flatness is first placed on substrate table WT. Preferably, the protrusions are cleaned before the substrate is placed on the protrusions, to remove any contaminant material from the protrusions. This may be done in any known way.

The program causes the processor 52 to obtain as series of measurement results from measuring device 50 that are characteristic of the height profile h(r) of the reference substrate on the substrate table WT. The processor 52 stores the results of these measurements. This process may be repeated a number of times with the reference substrate located at different positions on substrate table, and/or with different reference substrates.

Next the processor 52 computes whether and which protrusions 24 have a height deviation, and preferably also how the size of the deviation. Typically, this is done by deriving for each particular protrusion a height value of the height profile h(r) in a respective regions of locations "r" on the surface of the reference substrate that overlies the particular protrusion. The height value can be determined in any way. In one embodiment, for example, the excess is determined by sampling the height profile h(r) at a predetermined position r=rp relative to the protrusion (preferably right over the protrusion). In another embodiment the excess is determined by integrating (or summing) the measured height profile h(r) of the substrate over a predetermined region that overlies the protrusion, and no other protrusions, optionally weighting the height profile h(r) with a weight function $w_p(r)$.

In an embodiment, from the collection of height values for all protrusions, the processor 52 determines the lowest value, i.e. the height value of the protrusion over which the exposed surface of the substrate is closest to the support table. The difference between the height value for a particular protrusions and this lowest value is called the excess height of the profile for the particular protrusion.

Preferably, the height profiles h(r) from a number of different measurements are combined, the different profiles having been measured with the reference substrate at different positions, or with different substrates, so as to reduce or eliminate effects due to unevenness of the substrate. For example, the processor 52 may determine the excess height from the average $h_{av}$ of different profiles $h_i(r)$ (i=1, 2 . . . ) obtained in this way.

From the computed excess heights of the profile for the particular protrusions, the processor 52 computes the excess height of the underlying protrusion 24. Preferably, an empirically determined relation is used for this purpose. For example a relation determined by measuring the height of the substrate repeatedly, each time after removing a given amount of material from a test protrusion, or after firing a given a number of laser shots at the protrusion 24. The empirical relation may be represented, for example, by a table that associates a computed value of excess of the substrate to an excess height or a number of laser shots. Instead of a table, a polynomial function may be used, for example, with empirically determined coefficients.

Subsequently, the reference substrate is removed, so that protrusions 24 are exposed. The processor 52 now controls the material removing device 54 to aim at a series of protrusions 24 successively, for which an excess height has been detected. When the material removing device 54 is aimed at such a protrusion, the processor 52 controls the material removing device 54 to fire the number of shots that is expected to remove the excess height that has been determined for that protrusion. The power level of the laser 40 during firing the shots is set to a level that is sufficient to remove material of the protrusion.

When the excess height has been computed directly in terms of the number of shots, this is straightforward. Otherwise, an empirical relation between the number of shots and the amount of height change may be used to determine the number of shots. Instead of using a series of shots a continuous pulse may be used, the processor 52 selects the duration and/or the intensity of the pulse according to the excess height of protrusion, for example, according to a table that relates height reduction of protrusions to the duration and/or intensity. Similarly, a combination of pulses with different durations and/or intensities may be used.

In another embodiment, from the collection of height values for all protrusions, the processor 52 determines the highest value, i.e. the height value of the protrusion over which the exposed surface of the substrate is furthest from to the support table. The difference between the height value for a particular protrusions and this highest value is called the height deficit of the profile for the particular protrusion.

The processor 52 now controls the material removing device 54 to aim at a series of protrusions 24 successively, for which a height deficit has been detected. When the material removing device 54 is aimed at such a protrusion, the processor 52 controls the material removing device 54 to fire the number of shots with a power density that is expected to cause the protrusion to swell with the height deficit that has been determined for that protrusion. In this embodiment, the power level of the laser 40 during firing of the shots is set below a level that is sufficient to remove material of the protrusion.

The material removing and swelling embodiments may be combined, in a process wherein the height of some protrusions is increased by swelling and the height of others is decreased by removal. For this purpose, a reference height may be selected, for example, an average measured height of the protrusions and protrusions that have a height below this reference height may be made to swell and the height of protrusions above this reference height may be reduced by removal of protrusion material.

It should be appreciated that the invention is not limited to the use of a laser as a material removing device, although, of course, a laser is especially advantageous because it can conveniently be combined with a lithographic apparatus. Alternative material removing devices include a polishing machine, with a sufficiently small polishing head that can be positioned relative to the wafer table so that at each position an individual protrusion is polished to remove material from that protrusion, substantially without affecting the height other protrusions. In this case, the force with which the polishing head is pressed against the protrusion is set to a level that makes it possible to remove material of the protrusion. The force and/or polishing duration are set according to the excess height that has been determined for the protrusion. Any other material removing technique that can be directed at individual protrusions may be used, e.g. abrasion by an electron beam.

In fact, it is not even necessary that material can be removed from protrusions individually, as long as the amount of material removed from respective protrusions can be controlled independently. For example, suppose the removing device can be set to different gradients, removing material from more than one protrusion at a time but with a gradient in the removed amount as a function of position of the protrusion. In this case, different successive gradient settings may be used to control the removed amount of different protrusions independently of one another.

Although the invention has been described in terms of removal of material, it should be appreciated that, without deviating from the invention, the height of the protrusions may also be adjusted by depositing material onto selected protrusions. Any known localized depositing technique, such as sputtering with a source moved close to the protrusion, may be used. In this case, an abduction unit or a getter shield is preferably provided in the vicinity of the protrusion to capture excess material that is not deposited on the protrusion. Of course, any combination of a material removing device and a material adding device may be used.

In the case that material is added, the protrusion with the lowest height value need not be used as reference to determine excess height values. Instead, the highest height value should be used if only the adding of material is possible, to determine the amount of deposition needed to bring the other protrusions level with the protrusion with the highest height value. When both adding and removing is possible, any reference height may be used to draw the protrusions level with. This height may be selected so that only a predetermined small fraction of the protrusions requires added material for example.

It should also be understood that, instead of the described way of computing the height deviations of the protrusions, other methods of determining the height deviations of protrusions may be used. For example, the height profile may be fitted to a model for the height profile, in which the heights of the protrusions are free parameters that are fitted so as to best approximate the measured profile. An example of a model is that the height profile is the sum $h(r)=\Sigma h_i b(r+r_i)$ where the sum is over the protrusions, labeled "i", $h_i$ is the height of protrusion i and $b(r)$ is the height profile for a protrusion of unit height, which may be determined experimentally or theoretically. Other related statistical estimation techniques may be used as well. Similarly, ways of using the height profiles for the same substrate at different positions that do not merely involve averaging may be used, for example by fitting a model $\Sigma h_i \{b(r+r_i)-b(r+d+r_i)\}$ to a measured difference $h_1(r)-h_2(r+d)$ of two profiles obtained for the same reference substrate, with a measured profile $h_1(r)$ at a first position and a second measured profile $h_2(r)$ when the reference substrate has been displaced with respect to the substrate table over an offset "d" with respect to the first position.

Furthermore, it should be realized that although the invention has been described in terms of height measurements using a substrate located on the substrate table, the processor 52 may also used height measurements obtained from the protrusions directly, when the protrusions are uncovered. The advantage of measuring on a substrate is that use can be made of equipment that is already available in the lithographic apparatus for use in normal operation.

Furthermore, it should be realized that although a single processor 52 has been shown by way of example, the necessary computations and control operation may of course be executed by several processors. Similarly, although measurement and adjustment have been described as consecutive operations, the adjustment may of course be postponed for an arbitrary time after the measurement, allowing other operations to be performed in between.

Also, although the invention has been described for a transmissive type apparatus, it should be realized that the invention may also be applied to a reflective type apparatus. Furthermore, although the invention has been described for a substrate table, it should be realized that the invention may be applied to a support table for another article in the lithographic projection apparatus, such as a table for supporting a mask or a reticle. Furthermore, although the invention has been described for protrusions that are made entirely of one material, it should be realized that the invention may be applied to protrusions in which different parts of the protrusion are made of different material, for example, by providing a coating layer at least at the top of each protrusion attached to the underlying part of the protrusion.

While specific embodiments of the invention have been described above, it will be appreciated that the invention may be practiced otherwise than as described. The description is not intended to limit the invention.

What is claimed is:

1. A lithographic projection apparatus comprising:
    a beam production system for providing a beam of radiation, patterning the beam of radiation, and projecting the patterned beam onto a target portion of a substrate;
    a support table for supporting an article so that a planar surface of the article lies in a predetermined plane transverse to a propagation direction of the projection beam, the support table having a support surface and an array of protrusions extending from the support surface to support the article on the protrusions, at least a top of each protrusion being substantially formed of an integral protrusion material;
    a detector for detecting height deviations of the protrusions that affect a surface flatness of the article;
    a height adjustment device arranged to independently modify a height of the protrusion material of individual protrusions when the support table is operable in the apparatus; and
    a controller coupled between the detector and the height adjustment device and arranged to control the height adjustment device to adjust the height of the protrusions corresponding to the detected height deviations of the protrusions that affect the surface flatness of the article.

2. A lithographic projection apparatus according to claim 1, wherein the height adjustment device is arranged to remove and/or add the protrusion material from or to the protrusions that affect the surface flatness of the article.

3. A lithographic projection apparatus according to claim 1, wherein the height adjustment device is arranged to make the protrusion material assume an at least semi-permanently swelled phase that increases the height of the individual protrusion.

4. A lithographic projection apparatus according to claim 1, wherein the article is the substrate.

5. A lithographic projection apparatus according to claim 1, wherein the article is a reticle or mask that is used to pattern the beam.

6. A lithographic projection apparatus according to claim 1, wherein the height adjustment device comprises a material removing device with an adjustable removing strength, the controller being switchable between a first mode wherein the removing strength of the removing device is set above a first level sufficient to remove part of the protrusion material, and a second mode wherein the removing strength is set below a second level that is insufficient to remove part of the protrusion material, but is sufficient to remove contamination materials from the protrusions.

7. A lithographic projection apparatus according to claim 1, wherein the height adjustment device comprises a laser arranged to project a beam onto selectable protrusions, with an intensity sufficient to cause the protrusion material to be removed from the protrusion, the controller being arranged to control respective accumulated power doses delivered by the laser to the protrusions dependent on the height deviations measured for the protrusions.

8. A lithographic projection apparatus according to claim 1, wherein the height adjustment device comprises a laser arranged to project a beam onto selectable protrusions with an intensity level selected to heat the protrusion material so that the protrusion material assumes an at least semi-permanently swelled phase after cooling, the controller being arranged to control an energy density delivered by the laser to the protrusions dependent on the height deviations measured for the protrusions.

9. A lithographic projection apparatus according to claim 1, wherein the detector comprises:
    a measuring unit for measuring a height profile of the planar surface of the article opposite a further surface of the article that is supported by the support table; and a computation unit arranged to compute the height deviations of the protrusions from the height profile, the controller controlling the height adjustment device dependent on the height deviation.

10. A lithographic projection apparatus according to claim 1, wherein the height adjustment device comprises a localized material deposition unit, the support table and/or the deposition unit being moveable relative to the other under control of the controller.

11. A method of adjusting a height of at least one protrusion on a support surface of a support table for holding an article with a planar surface in a predetermined plane transverse to a beam path in a lithographic projection apparatus, the support table comprising at least a chuck and a table surface element mounted on the chuck, the surface element comprising an array of protrusions, each of which comprises a top that is integrally made of protrusion material, the protrusions extending from the support surface for supporting the article, the method comprising:

measuring height deviations of the protrusions that affect a surface flatness of the planar surface of the article when the surface element is mounted on the chuck; and adjusting a height of the protrusion material of at least one protrusion that corresponds to the detected height deviations of the protrusions while the surface element remains mounted on the chuck.

12. A method according to claim 11, wherein adjusting the height of the protrusion material comprises removing the protrusion material that corresponds to the detected height deviations of the protrusions.

13. A method according to claim 11, wherein adjusting the height of the protrusion material comprises heating the protrusion material to cause an at least semi-permanent swelling of the protrusion material to produce a height increase that corresponds to the detected height deviations of the protrusions.

14. A method according to claim 11, wherein said measuring and said adjusting are executed while the support table is in an operable position in the lithographic projection apparatus.

15. A method according to claim 11, wherein said measuring comprises:

placing an article on the support table supported by the protrusions;

measuring a height profile of the planar surface of the article on a side facing away from the protrusions; and computing the height deviations of the protrusions from the height profile.

16. An article support system for use in a lithographic apparatus, the support system comprising:

a support table for supporting an article so that a planar surface of the article lies in a predetermined plane, the support table having a support surface and an array of protrusions extending from the support surface to support the article on the protrusions, at least a top of each protrusion being substantially formed of an integral protrusion material;

a detector for detecting height deviations of the protrusions that affect a surface flatness of the article;

a height adjustment device arranged to independently modify a height of the protrusion material of individual protrusions; and a controller coupled between the detector and the height adjustment device and arranged to control the height adjustment device to adjust the height of the protrusions corresponding to the detected height deviations of the protrusions that affect the surface flatness of the article.

* * * * *